United States Patent
Hiura et al.

(10) Patent No.: US 8,168,964 B2
(45) Date of Patent: May 1, 2012

(54) SEMICONDUCTOR DEVICE USING GRAPHENE AND METHOD OF MANUFACTURING THE SAME

(75) Inventors: Hidefumi Hiura, Minato-ku (JP); Fumiyuki Nihei, Minato-ku (JP); Tetsuya Tada, Tsukuba (JP); Toshihiko Kanayama, Tsukuba (JP)

(73) Assignee: NEC Corporation, Tokyo (JP)

( * ) Notice: Subject to any disclaimer, the term of this patent is extended or adjusted under 35 U.S.C. 154(b) by 215 days.

(21) Appl. No.: 12/529,501

(22) PCT Filed: Feb. 27, 2008

(86) PCT No.: PCT/JP2008/053899
§ 371 (c)(1),
(2), (4) Date: Sep. 1, 2009

(87) PCT Pub. No.: WO2008/108383
PCT Pub. Date: Sep. 12, 2008

(65) Prior Publication Data
US 2010/0102292 A1   Apr. 29, 2010

(30) Foreign Application Priority Data
Mar. 2, 2007  (JP) ................................ 2007-052887

(51) Int. Cl.
*H01L 29/167*   (2006.01)

(52) U.S. Cl. ........ 257/9; 257/14; 257/E29.086; 977/755

(58) Field of Classification Search ................ 257/9, 29, 257/76, E29.086, E21.042, 14, E29.068; 438/478; 977/755, 938, 940
See application file for complete search history.

(56) References Cited

U.S. PATENT DOCUMENTS

| | | | |
|---|---|---|---|
| 2004/0253820 A1* | 12/2004 | DeHeer et al. | 438/689 |
| 2005/0100736 A1* | 5/2005 | Hyldgaard et al. | 428/408 |
| 2007/0187694 A1* | 8/2007 | Pfeiffer | 257/76 |

FOREIGN PATENT DOCUMENTS

| | | |
|---|---|---|
| JP | 2541091 B2 | 9/1994 |
| JP | 3447492 B2 | 5/1998 |
| JP | 2007-335532 A | 12/2007 |

OTHER PUBLICATIONS

Claire Berger et al., "Electronic Confinement and Coherence in Patterned Epitaxial Graphene", Science, May 26, 2006, pp. 1191-1195, vol. 312.
H. Hiura et al., "Role of $sp^3$ defect structures in graphite and carbon nanotubes", Nature, Jan. 13, 1994, pp. 148-151, vol. 367, No. 6459.
Thomas W. Ebbesen et al., "Graphene in 3-Dimensions: Towards Graphite Origami", Advanced Materials, Jun. 1995, pp. 582-586, vol. 7, No. 6.

(Continued)

*Primary Examiner* — Davienne Monbleau
*Assistant Examiner* — Fazli Erdem
(74) *Attorney, Agent, or Firm* — Sughrue Mion, PLLC

(57) ABSTRACT

A semiconductor graphene is used for a channel layer, and a metal graphene is used for electrode layers for a source, a drain, and a gate which serve as interconnections as well. An oxide is used for a gate insulating layer. The channel layer and the electrode layers are located on the same plane.

8 Claims, 12 Drawing Sheets

OTHER PUBLICATIONS

Hidefumi Hiura, "Generation of circular and hexagonal microholes in a graphite surface", J. Mater. Res., May 2001, pp. 1287-1292, vol. 16, No. 5.

K.S. Novoselov et al., "Electric Field Effect in Atomically Thin Carbon Films", Science, Oct. 22, 2004, pp. 666-669, vol. 306.

K.S. Novoselov et al., "Two-dimensional gas of massless Dirac fermions in graphene", Nature, Nov. 10, 2005, pp. 197-200, vol. 438.

Yuanbo Zhang et al., "Experimental observation of the quantum Hall effect and Berry's phase in graphene", Nature, Nov. 10, 2005, pp. 201-204, vol. 438.

* cited by examiner

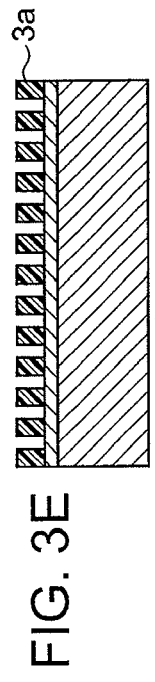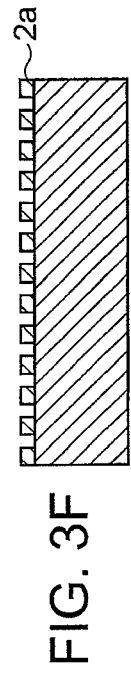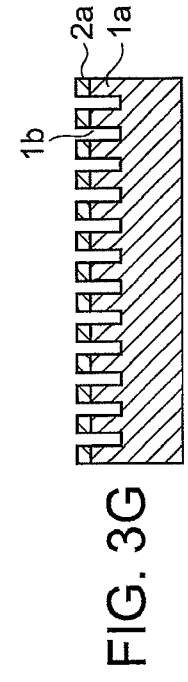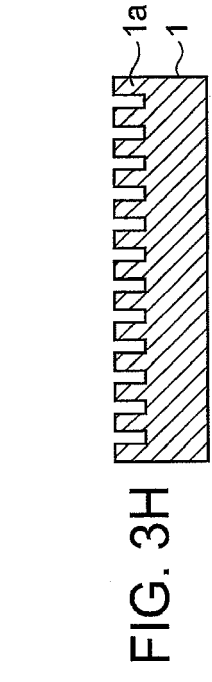
FIG. 3E  FIG. 3F  FIG. 3G  FIG. 3H
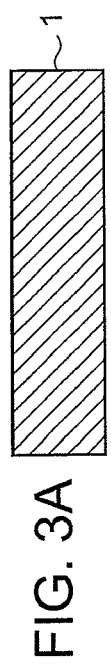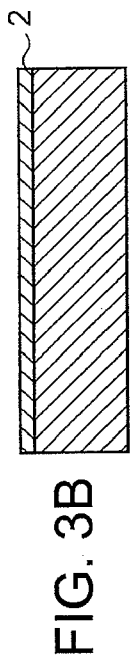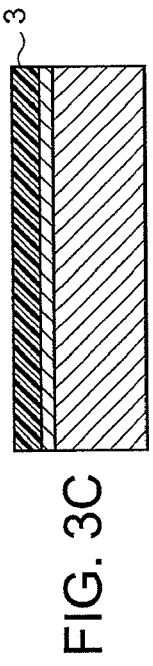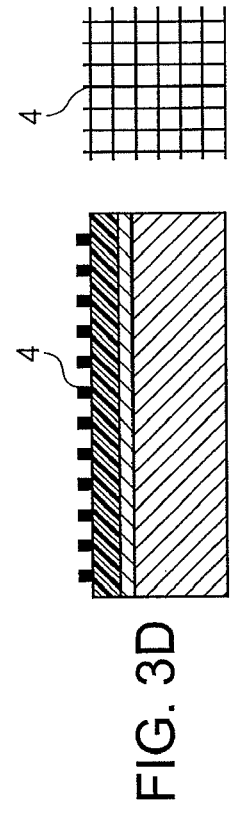
FIG. 3A  FIG. 3B  FIG. 3C  FIG. 3D

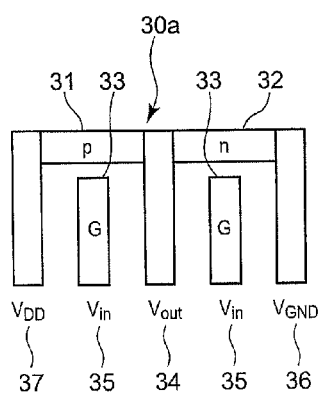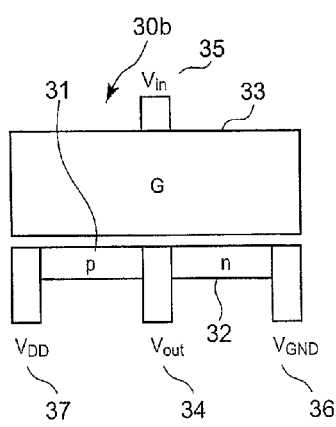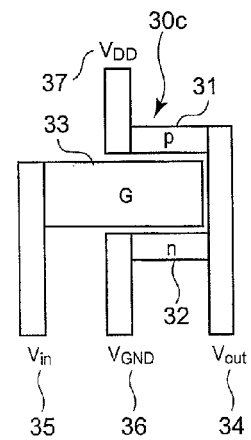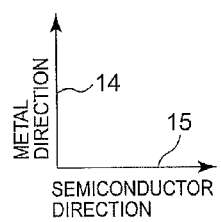
FIG. 7A          FIG. 7B          FIG. 7C

SEMICONDUCTOR DEVICE USING GRAPHENE AND METHOD OF MANUFACTURING THE SAME

TECHNICAL FIELD

The present invention relates to a semiconductor device and a method of manufacturing the same. More particularly, the present invention relates to a field-effect transistor including a p-type channel or an n-type channel operable at an ultrahigh speed with low electric power consumption in which all component elements such as a channel, electrodes for a gate, a source, and a drain, and interconnections are formed of graphene, a semiconductor device such as a logic circuit or a memory cell circuit which combines such field-effect transistors, and a method of manufacturing such a semiconductor device.

BACKGROUND ART

The current information-oriented society is supported by semiconductor devices represented by CMOS (complementary metal oxide semiconductors) based on silicon. The silicon semiconductor industry has heretofore achieved miniaturization with both of high integration and high performance by continuously decreasing applicable ranges of microfabrication technology, such as lithography technology, etching technology, and deposition technology, from micrometers to several tens of nanometers. However, it is inevitable that the device dimension will reach an atomic level or a molecular level in the near future. Thus, there have been pointed out physical limitations of conventional semiconductor materials such as silicon and device structures.

In order to breakthrough such an obstructed situation, novel semiconductor materials and device structures based on a new concept are being sought at the present time. Graphene, which has attracted much attention in recent years, may have great potential to meet those demands.

Graphene is obtained by separating only one layer of graphite, which is a layered material formed of only $sp^2$-hybridized carbons. Graphene is a stable monatomic-layer planar material.

Generally, graphene refers to one layer of graphite. Nevertheless, graphene may refer to two or more layers of graphite in some cases. Graphene has a structure of a quasi-two-dimensional sheet in which six-membered carbocyclic rings, each of which has a regular hexagonal shape with carbon atoms at its vertexes, are closely packed in a honeycomb lattice. The distance between carbon atoms is about 1.42 Å (angstroms) (=0.142 nm). In a case where a substrate is formed of graphite, the thickness of the layer is 3.3 Å to 3.4 Å (=0.33 nm to 0.34 nm). In cases of other substrates, the thickness of the layer is about 10 Å (=1.0 nm). The graphene plane can be assumed to have various sizes ranging from a molecular size in which the length of a piece is on the order of nanometers, theoretically, to an infinite. Furthermore, graphene has a three-fold rotoreflection axis on the plane, which results from its honeycomb structure. Therefore, when graphene is rotated around a certain point through 120 degrees on the plane, it coincides with the original structure.

Graphene has two characteristic edge structures, one of which is an armchair edge, the other of which is a zigzag edge. Since a graphene plane is of three-fold rotoreflection, the armchair directions and the zigzag directions respectively appear with every 120-degree rotation on the plane. The armchair directions and the zigzag directions are perpendicular to each other.

According to the preceding research, a phenomenon has been observed in which those two edge structures are produced when a graphene is torn by an external force. The cause for this phenomenon is the fact that a graphene tends to shear in its armchair directions and zigzag directions. For example, *Nature*, Vol. 367, 148-151, 1994 (Non-patent Document 1) and *Advanced Materials*, Vol. 7, No. 6, 582-586, 1995 (Non-patent Document 2) illustrate a graphene having a regular geometric structure, which remains on a surface of graphite after the graphite has been peeled off. Japanese Patent No. 2541091 (pp. 6-8; FIGS. 3-10) (Patent Document 1), which corresponds to U.S. Pat. No. 5,925,465 (Jul. 20, 1999), Sheets 2 to 8, FIGS. 3 to 8, discloses a method of manufacturing a graphene on the order of submicrometers with use of an atomic force microscope (AFM). Furthermore, with a scanning tunneling microscope (STM), a phenomenon has been observed in which the two characteristic edge structures of an armchair edge and a zigzag edge are produced when a graphene is heated on a surface of graphite. This phenomenon relates to the roughening transition and occurs conceivably because the armchair edges and the zigzag edges are more stable in thermodynamics than other edge structures.

For example, *Journal of Materials Research*, Vol. 16, No. 5, 1287-1292, 2001 (Non-patent Document 3) describes the details of holes having a geometric shape of submicrometers with a characteristic edge structure provided by heating a graphene. Japanese patent No. 3447492 (column 7, line 43 to column 10, line 30; FIGS. 3-11) (Patent Document 2), which corresponds to U.S. Pat. No. 6,540,972 B1 (Apr. 1, 2003), column 5, line 16 to column 9, line 19, FIGS. 3-11, discloses a method of forming a graphene piece having a geometric shape by systematically arranging those holes.

As described later, if a graphene has a size of the order of nanometers, the quantum size effect becomes so significant that an edge structure of the graphene, such as an armchair edge or a zigzag edge, defines electronic properties of the graphene.

According to the recent research, the field effect in a semimetal graphene has been reported in *Science*, 306, 666-669, 2004 (Non-patent Document 4). In a device using a metal graphene shown in Non-patent Document 4, a metal graphene piece, which serves as a channel, is disposed on a highly-doped silicon substrate via a silicon oxide. Both ends of the metal graphene piece are connected to two gold electrodes so as to form source and drain electrodes. Thus, a field-effect transistor is formed with highly-doped silicon serving as a back gate electrode. A metal graphene piece is obtained by using standard lithography and etching to cut graphene out of a surface of highly-oriented pyrolytic graphite (HOPG). Because the graphene channel of this device has a large width of at least 80 nanometers, it exhibits no quantum size effect resulting from its edge structure, i.e., it is fundamentally metallic. Generally speaking, the field effect can be observed only in semiconductors, but not in metals because the electric field is allowed to penetrate deeply into semiconductors, but never into metals. Nevertheless, the field effect is seen in a metal grapheme. The reason for the extraordinary phenomenon is because the metal graphene used has only one to several layers and is thus extremely thin in the thickness direction such that an electric field due to a gate electrode can surpass the shield due to carriers in the graphene channel. Since the graphene channel is not intentionally doped, the same number of conduction electrons and positive holes are present for carriers when a gate voltage is zero without an electric field. If a negative gate voltage is applied, electrons are depleted such that positive holes are increased and thus used for conduction. If a positive gate voltage is applied, positive holes are depleted such that electrons are increased and thus used for conduction. In other words, while this device demonstrates what is called ambipolar conduction, both of electrons and positive holes cannot be depleted simultaneously. Thus, the device does not completely establish an off state. Therefore, in view of standard performance characteristics of a field-effect transistor, this graphene device exhibits low performance. However, this device has attracted much attention as a very interesting material in pure physics because a metal graphene behaves as a two-dimensional gas that is ideal and unique. Some reports on use of a metal graphene device having substantially the same configuration as that in Non-patent Document 4 are included in *Nature,* 428, 197-200, 2005 (Non-patent Document 5) and *Nature,* 428, 201-204, 2005 (Non-patent Document 6). Non-patent Documents 5 and 6 have reported relativistic quantum mechanical effects that have not ever been measured, such as massless electrons and the unusual integer quantum Hall effect, which has not been seen in general metals, and have thus made great contributions to enhancement of human intelligence and development of science.

Additionally, *Science,* 312, 1191-1196, 2006 (Non-patent Document 7) has reported technology of producing a graphene on a silicon carbide (SiC) substrate with illustration of a prototype of a graphene device in which all of source, drain, and gate electrodes are formed of graphene. However, in the graphene device shown in this document, the edge structure of the graphene channel is not controlled. In the first place, the width of the graphene channel is about 100 nm, which is too large to exhibit the quantum size effect.

DISCLOSURE OF INVENTION

Problem(s) to be Solved by the Invention

However, field-effect transistors utilizing graphene, as disclosed in Non-patent Documents 4, 5, 6, and 7, have some problems.

First, the field-effect transistors have a very poor on/off ratio of about 10 to about $10^2$ and do not establish an off state in practical use. Therefore, the electric power consumption is disadvantageously huge. This is attributable to the fact that a metal graphene is used as a channel. The reason is because a metal can increase and decrease the carrier density of the channel to some extent with an electric field of a gate electrode but cannot make the carrier density completely zero.

Second, the field-effect transistors have a problem that p-type and n-type conduction channels cannot be produced separately because they demonstrate ambipolar conduction. Therefore, a low-power-consumption inverter or the like cannot be formed by combining p-type and n-type transistors in a complementary manner. This is attributable to the fact that conduction electrons are induced in the channel in a case of a negative gate voltage while positive holes are induced in the channel in a case of a positive gate voltage. The reason is because a graphene demonstrates ambipolar conduction in the first place and has the same number of positive holes and electrons therein under no electric field.

Furthermore, the transistors of Non-patent Documents 4, 5, and 6 have a disadvantage that a contact resistance between a channel and an electrode is high because a graphene is only used for a channel. This is attributable to the fact that a metal such as gold is used for source, drain, and gate electrodes. The reason is because there are no viewpoints to construct a device with utilizing both features of a semiconductor graphene and a metal graphene.

Moreover, Non-patent Document 7 only discloses structural diagrams of field-effect transistors using graphene for source, drain, and gate electrodes as well as for a channel. Thus, there is a problem that those field-effect transistors do not operate as an actual device. This is attributable to the fact that the graphene width of a channel is as large as about 100 nm. The reason is because the used graphene is not small enough to significantly exhibit the quantum size effect and is not controlled in edge structure, which defines the electronic properties of the graphene.

Furthermore, the aforementioned field-effect transistors have a problem that the manufacturing cost is high. This is attributable to the fact that those field-effect transistors use graphene only for a channel, but materials other than graphene for electrodes and interconnections. The reason is because those transistors do not employ a method of using graphene for electrodes and interconnections so as to unify the kinds of materials and reduce the number of manufacturing steps.

In view of the above problems, a first object of the present invention is to provide a semiconductor device which is made compact on a two-dimensional plane and provided with high speed operation and low electric power consumption by using graphene having a controlled edge structure with a width of 20 nm or less, with which the quantum size effect is significant, and also to provide a method of manufacturing the same.

Furthermore, a second object of the present invention is to provide a semiconductor device which can reduce material cost by uniformly using graphene for all of components such as channels, electrodes, and interconnections of the semiconductor device and can reduce manufacturing cost by avoiding using materials other than graphene and simplifying manufacturing steps, and also to provide a method of manufacturing the same.

Means to Solve the Problem(s)

According to the present invention, there is provided a semiconductor device using a field effect, characterized by comprising: a channel layer formed of semiconductor graphene; electrode layers formed of metal graphene for a source, a drain, and a gate, the electrode layers serving as interconnections as well; and a gate insulating layer for insulating the channel layer and the gate electrode layer from each other, wherein the channel layer and the electrode layers are located on the same plane.

Furthermore, according to the present invention, there is provided a method of manufacturing a semiconductor device, characterized by comprising: producing a graphene on a substrate; forming the graphene into a desired device structure through lithography and etching; forming an edge structure of the graphene into a zigzag edge or an armchair edge through oxidation reaction or reduction reaction; doping the semiconductor graphene; and depositing an insulating film.

Effect(s) of the Invention

According to the present invention, it is possible to provide a semiconductor device which is made compact on a two-dimensional plane and provided with high speed operation and low electric power consumption by using graphene having a controlled edge structure with a width of 20 nm or less, with which the quantum size effect is significant, and also to provide a method of manufacturing the same.

Furthermore, according to the present invention, it is possible to provide a semiconductor device which can reduce material cost by uniformly using graphene for all of components such as channels, electrodes, and interconnections of the semiconductor device and can reduce manufacturing cost by avoiding using materials other than graphene and simplifying manufacturing steps, and also to provide a method of manufacturing the same.

BRIEF DESCRIPTION OF DRAWINGS

FIGS. 3A to 3H are process diagrams showing a method of processing a surface of HOPG in a method of manufacturing a full-graphene device according to an embodiment of the present invention.

FIG. 7A is a diagram showing a full-graphene complementary inverter according to Example 2 of the present invention, in which p-type and n-type channels are controlled by two independent gate electrodes.

FIG. 7B is a diagram showing a full-graphene complementary inverter according to Example 2 of the present invention, in which p-type and n-type channels are positioned on the same line and controlled by one gate electrode.

FIG. 7C is a diagram showing a full-graphene complementary inverter according to Example 2 of the present invention, in which p-type and n-type channels are positioned in parallel to each other and controlled by one gate electrode.

BEST MODE FOR CARRYING OUT THE INVENTION

Embodiments of the present invention will be described below with reference to the drawings.

Graphene is a quasi-two-dimensional substance produced from a single-layer graphite and has one to several layers. Graphene is a material for an ideal two-dimensional gas. The mobility of a single-layer graphene hardly depends upon the temperature and is about $10^4$ $cm^2 \cdot V^{-1} \cdot s^{-1}$. The mobility of a multilayer graphene having several layers is about $1.5 \times 10^4$ $cm^2 \cdot V^{-1} \cdot s^{-1}$ at 300 K (Kelvin) and about $6 \times 10^4$ $cm^2 \cdot V^{-1} \cdot s^{-1}$ at 4 K. The mobility of the graphene has a considerably large value that is at least several times to ten times the mobility of silicon.

The graphene plane can be assumed to have various sizes ranging from a molecular size in which the length of a piece is on the order of nanometers, theoretically, to an infinite. However, if the size of a graphene is on the order of nanometers, the graphene exhibits electronic properties that are completely different from those of a macroscopic bulky one. This is called the quantum size effect. When a graphene has a macroscopic size, it exhibits characteristics of a metal similar to ordinary graphite. When a graphene has a size on the order of nanometers, it exhibits characteristics of a metal or characteristics of a semiconductor having a band gap, depending upon its edge structure.

Figure 12:
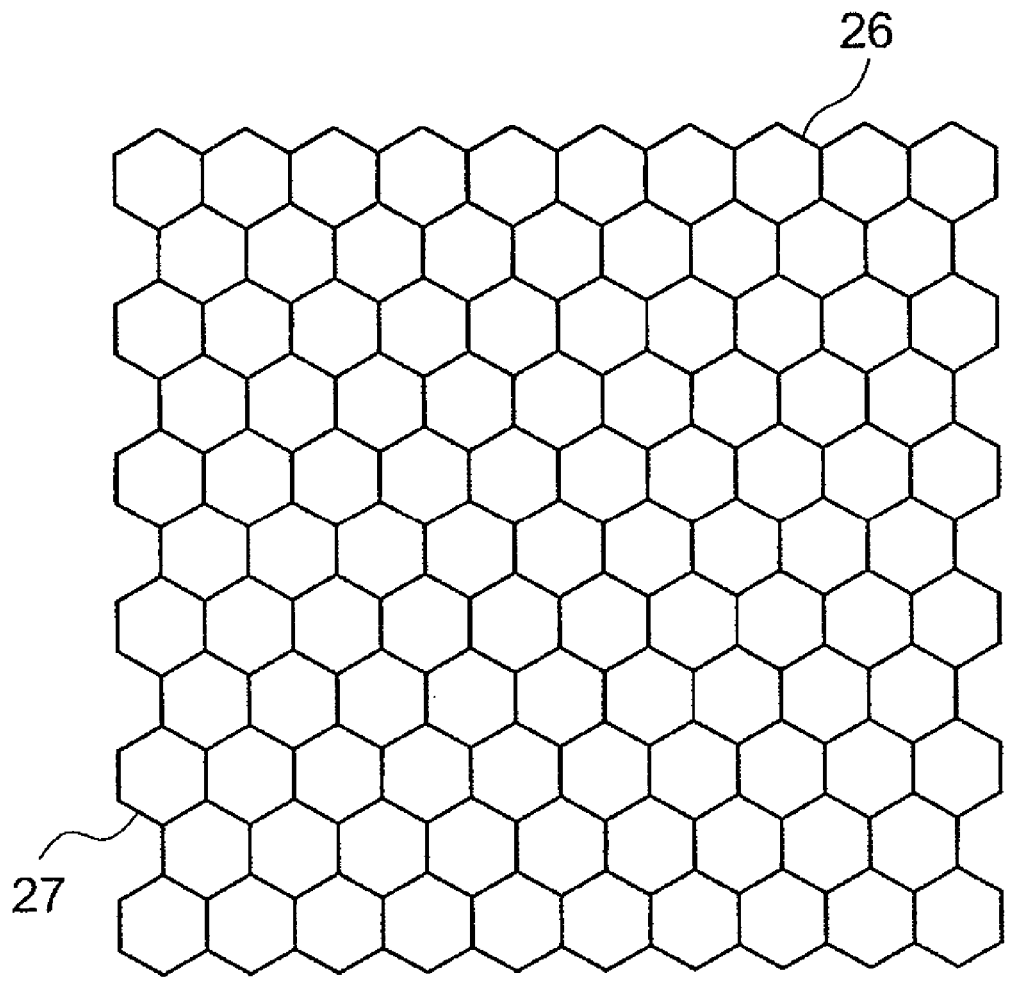
FIG. 12 is a diagram showing a structure of a graphene.

As shown in FIG. 12, graphene has two characteristic edge structures, one of which is a zigzag edge 26, the other of which is an armchair edge 27. For example, assuming a belt-like graphene (graphene ribbon) having short sides of 20 nm or less and long sides sufficiently longer than the short sides, the graphene ribbon has metal characteristics in a direction of the long sides if the long sides have a zigzag edge structure and has semiconductor characteristics if the long sides have an armchair edge structure. The band gap of the armchair type graphene ribbon depends upon the length of the short sides. The gap tends to increase as the length of the short sides becomes shorter. Such electronic properties of a graphene, which depend upon the structure, remind us of the electronic properties of a carbon nanotube. From the viewpoint of structures, a carbon nanotube is equivalent to a graphene ribbon wound along its long sides with the two long sides being connected to each other. Conversely, a graphene ribbon is equivalent to a carbon nanotube cut along its major axis into a plane. Considering those structures, the similarity in electronic properties between a graphene ribbon and a carbon nanotube can be understood intuitively.

Summing up the above discussion, a graphene does not depend upon its edge structure and always has metal characteristics if it has a bulky size with a width larger than 20 nm. In a case where a graphene has a quantum size with a width of about 20 nm or less, the graphene has metal characteristics if it has an edge structure of zigzag edges. Those metal graphenes can be used as a material for electrodes and interconnections. Furthermore, in a case where a graphene has a quantum size with a width of about 20 nm or less, the graphene has semiconductor characteristics if it has an edge structure of armchair edges. This semiconductor graphene can be used as a material for a channel.

Next, electrical conduction properties of a graphene will be described. A graphene demonstrates ambipolar conduction unless it is subjected to a special operation such as doping. The ambipolar conduction refers to conduction in which carriers are induced irrespective of the polarity of an electric field. Positive holes are used for conduction under a positive electric field, and conduction electrons are used for conduction under a negative electric field. This is attributable to the fact that the same number of positive holes and conduction electrons are present in a graphene under no electric field. In a metal graphene, positive holes or conduction electrons cannot completely be depleted by the electric field effect. Therefore, when a transistor has a channel of a metal graphene, it cannot completely establish an off state. Thus, electric power consumption becomes large. A method of avoiding this problem is to use a semiconductor graphene. When a graphene has a width of 20 nm or less with armchair edges, it has characteristics of a semiconductor having a finite band gap and can establish an off state. Thus, improvement in lower electric power consumption is partially achieved. However, since a graphene demonstrates ambipolar conduction, a complementary inverter with low electric power consumption cannot be formed. Therefore, electric power consumption cannot sufficiently be lowered when a logic circuit or a memory cell is formed using semiconductor graphene. In order to avoid this problem, it is necessary to dope the semiconductor graphene. Lattice-substitution doping, charge-transfer doping, or the like can be used for this doping purpose. In the case of lattice-substitution doping, an impure element of the group III, such as boron, aluminum, gallium, or indium, or an impure element of the group VI, such as nitrogen, phosphorus, arsenic, or antimony, is substituted for carbon of the group IV forming a graphene. A p-type graphene semiconductor is obtained in the former case, and an n-type graphene semiconductor is obtained in the latter case. In the case of charge-transfer doping, a donor having an adequate ionization energy or an acceptor having an adequate electron affinity is placed on a surface of a semiconductor graphene. If the ionization energy of the donor is lower than an effective work function of the semiconductor graphene, then electrons move from the donor to the semiconductor graphene, so that conduction electrons are electrostatically induced in the semiconductor graphene. Furthermore, if the electron affinity of the acceptor is higher than an effective work function of the semiconductor graphene, then the acceptor draws electrons from the semiconductor graphene, so that positive holes are electrostatically induced in the semiconductor graphene. The donor preferably has an ionization energy of 6.4 eV (electron volts) or less. The acceptor preferably has an electron affinity of at least 2.3 eV. If the graphene is doped by the aforementioned proper method, only positive holes or only conduction electrons can be used as carriers in the graphene. Summing up the above discussion, a graphene that can serve as a p-type semiconductor or an n-type semiconductor can be obtained by doping a semiconductor graphene having armchair edges with a width of 20 nm or less. Furthermore, desired thresholds for the carrier density and the gate voltage can be defined by controlling the type and concentration of a dopant.

Next, a structure of a semiconductor device formed of graphene according to the present invention will be described.

Figure 1:
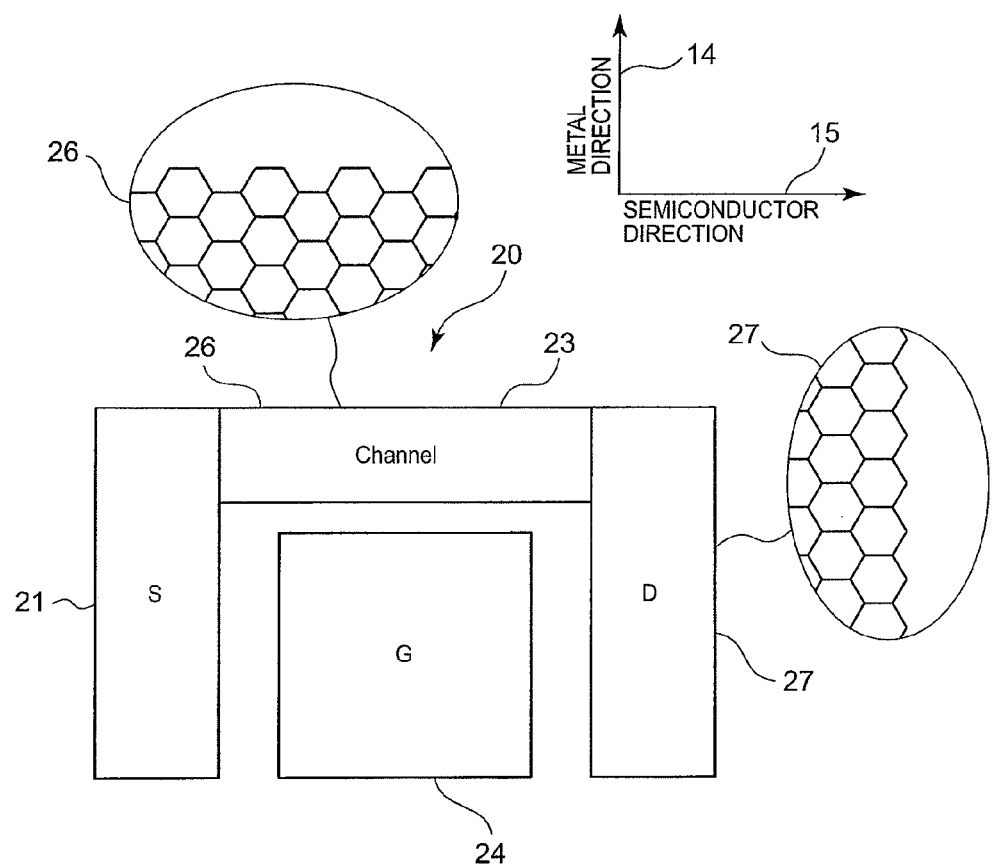
FIG. 1 is a diagram showing an example of a full-graphene base element according to the present invention.

FIG. 1 is a schematic plan view of a full-graphene field-effect transistor, which shows the most fundamental structure. As shown in FIG. 1, a base element 20 of the full-graphene field-effect transistor according to the present invention is formed of only graphene. Specifically, a gate electrode 24 is formed between a source electrode 21 and a drain electrode 22. Ends of the source electrode 21 and the drain electrode 22 facing each other are connected to each other by a channel 23. The connecting channel 23 has an edge structure of armchair edges 26 in its major axis to form a semiconductor graphene. Meanwhile, the source electrode 21, the drain electrode 22, and the gate electrode 24 are formed integrally with interconnections. Those electrodes have an edge structure of zigzag edges 27 in their major axes to form a metal graphene.

The integration of each of the source electrode 21, the drain electrode 22, and the gate electrode 24 with interconnections is a second feature of the full-graphene device, which is advantageous in that the device configuration can greatly be simplified.

Furthermore, the electrodes, the interconnections, and the channel are arranged on the same plane in the base element according to the present invention. Therefore, each component element is cut from one graphene sheet in a state such that it is connected to other elements. Accordingly, the base element is free from any Schottky barrier and any contact resistance between the electrodes and the channel and between the electrodes and the interconnections. That is, heat produced by resistance is suppressed ultimately. Additionally, since the mobility of the graphene is at least about $10^4$ $cm^2 \cdot V^{-1} \cdot s^{-1}$, the base element operates at an extremely high speed. Moreover, as described above, p-type and n-type conduction channels can be obtained separately by doping. Therefore, the full-graphene device illustrated in the present invention is an ultimate ideal transistor including a p-type channel and an n-type channel.

Figure 2A:
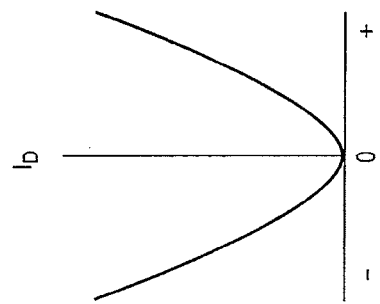
FIG. 2A is a graph showing transport properties of a full-graphene base element according to the present invention, in which the full-graphene base element is a field-effect transistor having a channel of a bulky multilayer graphene having several graphene layers.

FIGS. 2A to 2F show transport properties (drain current-gate voltage properties) of full-graphene field-effect transistors according to the present invention. FIG. 2A shows drain current-gate voltage properties of a field-effect transistor having a channel of a bulky multilayer graphene having several graphene layers, FIG. 2B those of a bulky single-layer graphene having a width of at least 100 nm, FIG. 2C those of a single-layer graphene having a width of 20 nm to 100 nm, with which the quantum size effect is found, FIG. 2D those of a single-layer graphene having a quantum size with a width of 20 nm or less and a controlled edge structure of armchair edges, FIG. 2E those of a single-layer graphene obtained by conducting p-type doping on the graphene of FIG. 2D, and FIG. 2F those of a single-layer graphene obtained by conducting n-type doping on the graphene of FIG. 2D.

In FIG. 2A, since the graphene channel has multiple layers, the carrier density is high, and the effect of application of a gate voltage is blocked. Accordingly, the drain current is hardly modulated by the gate voltage.

Figure 2D:
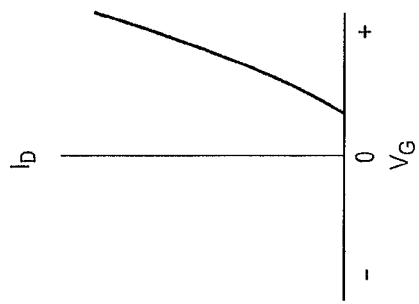
FIG. 2D is a graph showing transport properties of a full-graphene base element according to the present invention, in which the full-graphene base element is a field-effect transistor having a channel of a single-layer graphene having a quantum size with a width of 20 nm or less and a controlled edge structure of armchair edges.
Figure 2B:
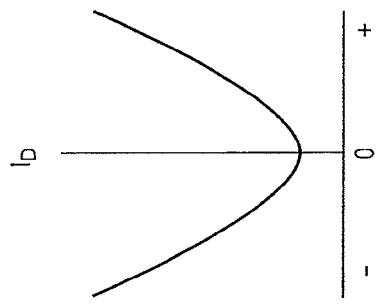
FIG. 2B is a graph showing transport properties of a full-graphene base element according to the present invention, in which the full-graphene base element is a field-effect transistor having a channel of a bulky single-layer graphene having a width of at least 100 nm.

In FIG. 2B, the modulation range becomes large. However, the drain current is not completely turned off.

Figure 2E:
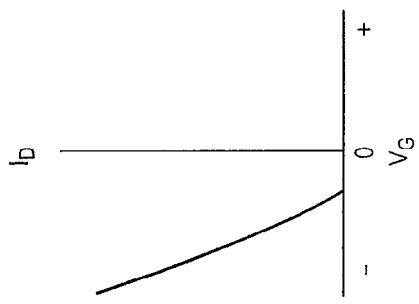
FIG. 2E is a graph showing transport properties of a full-graphene base element according to the present invention, in which the full-graphene base element is a field-effect transistor having a channel of a single-layer graphene obtained by conducting p-type doping on the graphene of FIG. 2D.
Figure 2C:
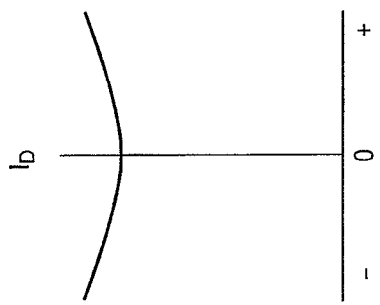
FIG. 2C is a graph showing transport properties of a full-graphene base element according to the present invention, in which the full-graphene base element is a field-effect transistor having a channel of a single-layer graphene having a width of 20 nm to 100 nm, with which the quantum size effect is found.
Figure 2F:
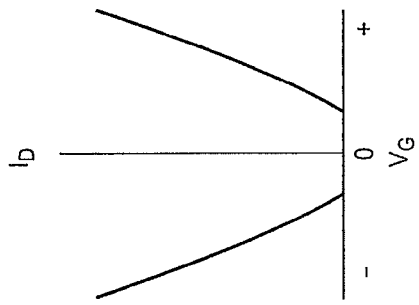
FIG. 2F is a graph showing transport properties of a full-graphene base element according to the present invention, in which the full-graphene base element is a field-effect transistor having a channel of a single-layer graphene obtained by conducting n-type doping on the graphene of FIG. 2D.

The transistors of FIGS. 2A and 2B have a metal graphene channel and exhibit low performance as a transistor. However, control in width of the graphene can allow an off-state configuration as shown in FIGS. 2C to 2F. The size of the transistor in FIG. 2C is still large, resulting in an incomplete off-state configuration. In FIG. 2D, the size of the transistor is sufficiently small, and the edge structure is controlled. Accordingly, the channel behaves as a complete semiconductor graphene. However, since the transistors of FIGS. 2C and 2D have an ambipolar conduction channel, practical applications of those transistors are limited. When pn conduction control is applied to the semiconductor graphene channel as shown in FIGS. 2E and 2F, it is possible to implement ideal transistor operation as p-type and n-type graphene channels, respectively. Summing up the above discussion, control in width of a graphene at 20 nm or less, with which the quantum size effect becomes significant, and control in edge structure with armchair edges are required to obtain a semiconductor graphene channel. Furthermore, pn conduction control is required to obtain p-type and n-type semiconductor graphene channels.

As described later in Examples 1-6, a basic logic circuit such as a complementary inverter, a NOR gate, a NAND gate, and a ring oscillation circuit, and a memory cell such as an SRAM (Static Random Access Memory) having flip-flop circuits can be formed by combining field-effect transistors using a metal graphene for electrodes and interconnections and a doped semiconductor graphene for a channel. In addition, a logic circuit and a memory cell with a high level of integration can also be formed.

Next, a manufacturing method according to an embodiment will be described with reference to FIGS. 3A to 7C.

First, a method of manufacturing a macroscopic graphene to be subjected to microfabrication will be described. There are two methods of obtaining a graphene, one of which is a method of pyrolyzing an Si surface on a 6H—SiC substrate at 1,200° C. to 1,700° C., the other of which is a method of stripping highly-oriented pyrolytic graphite (HOPG) in an appropriate manner. With the former method of pyrolyzing an SiC substrate, Si is removed from a surface of the substrate, and C is condensed to form a graphene layer on the surface. This method is superior in that it can obtain a graphene substrate to which a microfabrication method using general lithography and etching can directly be applied. However, it is difficult to control the number of layers in a graphene and to obtain a uniform graphene. On the other hand, the latter method of stripping HOPG is advantageous in that a large uniform graphene can be prepared. However, this method requires a step of transferring a stripped graphene to an appropriate substrate. The latter method of stripping HOPG will be described below in detail.

First, processes performed on an HOPG surface in steps shown in FIGS. 3A to 3H will be described.

As shown in FIG. 3A, a surface of an HOPG 1 is stripped by an adhesive tape or the like so as to expose a clean surface.

As shown in FIG. 3B, a silicon (Si) film 2 is deposited on the clean surface of HOPG 1 by a sputtering method. $SiO_2$ and the like may be used instead of Si. Furthermore, a CVD method may be used for deposition instead of the sputtering method.

As shown in FIG. 3C, a resist 3 is spin-coated on a surface of the silicon (Si) film 2.

As shown in FIG. 3D, the resist 3 is exposed with a meshed mask 4. Then the exposed resist 3 is developed by an appropriate developer.

As shown in FIG. 3E, a meshed resist mask 3a is obtained. Thereafter, the Si film 2 having the meshed resist mask 3a is subjected to dry-etching with sulfur hexafluoride ($SiF_6$) or the like. In the case of an $SiO_2$ film, wet-etching with hydrogen fluoride (HF) is employed.

As shown in FIG. 3F, a meshed Si film mask 2a is obtained by the transferring. Next, the surface of the HOPG having the meshed Si film mask 2a is subjected to dry-etching with $O_2$ or the like. Here, in the case of an $SiO_2$ film mask 2a to which the meshed mask has been transferred, the surface of the HOPG is subjected to dry-etching with $O_2$ or the like in the same manner.

As shown in FIG. 3G, there is obtained an HOPG having trenches 1a of a meshed pattern and the meshed Si film mask 2a covering its surface. Then the Si film mask 2a is removed from the surface of the HOPG by dry-etching with $SiF_6$ or the like. In the case of the $SiO_2$ film mask, the film mask is removed from the surface of the HOPG by wet-etching with HF or the like.

As shown in FIG. 3H, there is finally obtained an HOPG having the trenches 1a of a meshed pattern formed on its surface.

Next, a dispersion process of graphene pieces on a substrate will be described with reference to FIGS. 4A to 4F.

Figure 4A:
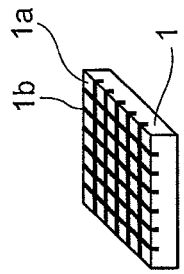
FIGS. 4A to 4F are process diagrams showing a method of manufacturing graphene pieces in a method of manufacturing a full-graphene device according to an embodiment of the present invention.

Referring to FIG. 4A, an HOPG 1 having trenches 1a of a meshed pattern formed on its surface is prepared by the method shown in FIGS. 3A to 3H. The uppermost surface is extremely thinly stripped so as to expose a clean surface.

Figure 4B:
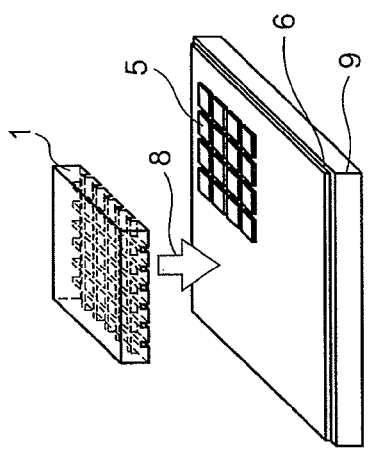

As shown in FIG. 4B, an appropriate substrate 9 such as glass is coated with a resist 6 or the like. A surface of the HOPG 1 having the meshed pattern is pressed upon a surface of the resist 6 as indicated by arrow 8.

Figure 4C:
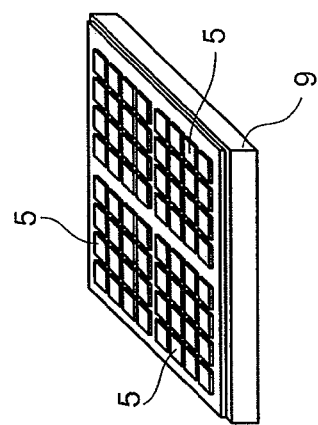

As shown in FIG. 4C, the same operations are repeated such that thick graphite pieces 5 finely divided are transferred to the overall area of the substrate.

Figure 4D:
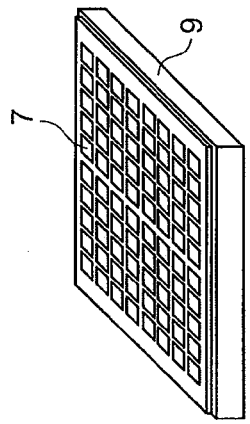

As shown in FIG. 4D, when those thick graphite pieces 5 have sufficiently been peeled off by an adhesive tape, graphene pieces 7 having one to several layers is eventually left on the resist-applied substrate 9.

Figure 4E:
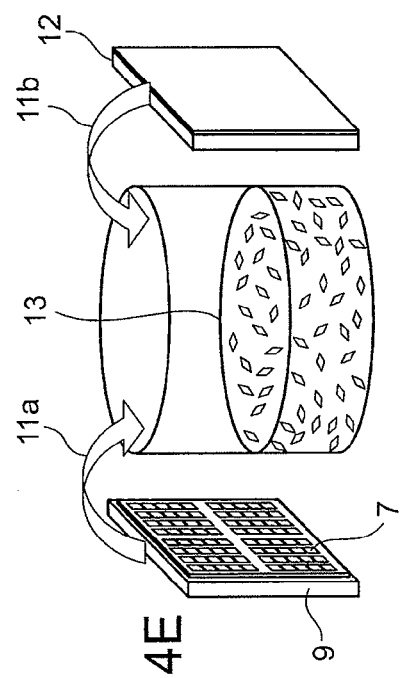

As shown in FIG. 4E, the resist-applied substrate 9 produced in FIG. 4D on which the graphene pieces 7 having one to several layers have been left is immersed in an appropriate solvent 13, such as acetone or methanol, as indicated by arrow 11a. As a result, the resist 6 is dissolved in the solvent, and the graphene pieces 7 having one to several layers are dispersed in the solvent. Thus, a suspension of the graphene pieces 7 having one to several layers is obtained. A substrate 12 such as a clean $SiO_2$/Si substrate is immersed in this suspension as indicated by arrow 11b to develop the graphene pieces 7 having one to several layers on the substrate 12.

Figure 4F:
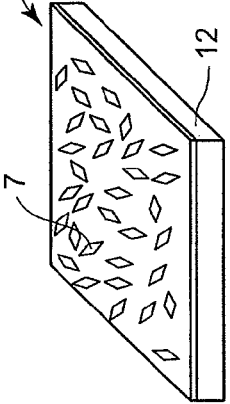

As shown in FIG. 4F, a fully drying process results in a substrate 12 on which the graphene pieces 7 having one to several layers have been finely divided.

Next, a method of manufacturing a full-graphene device from the a graphene piece 7 having one to several layers will be described with reference to process diagrams of FIGS. 5A to 5D.

Figures 5A, 5B, 5C, 5D:
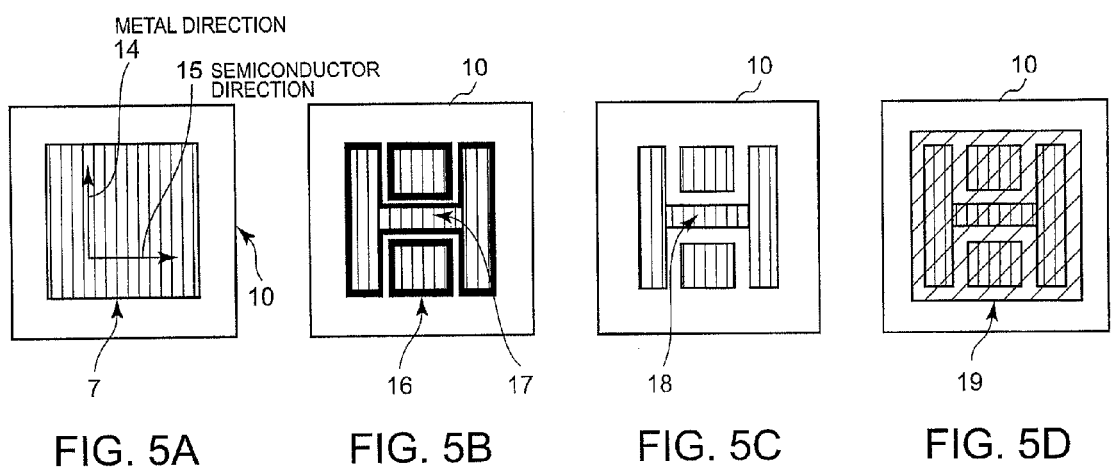
FIGS. 5A to 5D are process diagrams showing a method of manufacturing a full-graphene device according to an embodiment of the present invention.

As shown in FIG. 5A, an appropriate graphene is selected on the graphene substrate 10 as described in connection with FIG. 4F, or on the graphene-applied substrate 10. The crystallographic axis of the graphene is specified with a scanning probe microscope to define a zigzag edge direction (metal direction) 14 and an armchair edge direction (semiconductor direction) 15.

As shown in FIG. 5B, a device having a desired layout is formed by microfabrication using lithography and etching while the metal direction 14 and the semiconductor direction 15 are used as base axes.

A resist is spin-coated on the substrate 10. The substrate is exposed with a mask having a desired layout and then developed. Dry-etching with $O_2$ is conducted while the resist pattern is used as a mask. A full-graphene device having a quantum size is cut out, and the resist is removed.

However, an edge structure 16 of each graphene component is disturbed as shown in FIG. 5B if only dry-etching is conducted. Here, the reference numeral 17 denotes a full-graphene device obtained by lithography and etching. Therefore, an additional process is required to produce the edge structure with precision.

Specifically, oxidation reaction in an $O_2$ atmosphere under heating is employed. The reaction temperature is 500° C. to 700° C., and the reaction period is about 10 seconds to about 10 minutes. Furthermore, reduction reaction in an $H_2$ atmosphere under heating may be employed. The oxidation reaction or the reduction reaction proceeds from edges of the graphene to eliminate the disturbance of the structure. As shown in FIG. 5C, there can be obtained zigzag edges and armchair edges that are smooth in an atomic level. P-type or n-type doping is then conducted. Thus, a full-graphene device 18 controlled in edge structure is obtained.

As shown in FIG. 5D, an appropriate oxide film 19 such as $SiO_2$, $Al_2O_3$, $HfO_2$, or $ZrO_2$ is eventually deposited on the full-graphite device and is used as a gate insulating layer.

Examples of the present invention will be described below. As a matter of course, the present invention is not limited to those examples.

EXAMPLE 1

Figure 6:
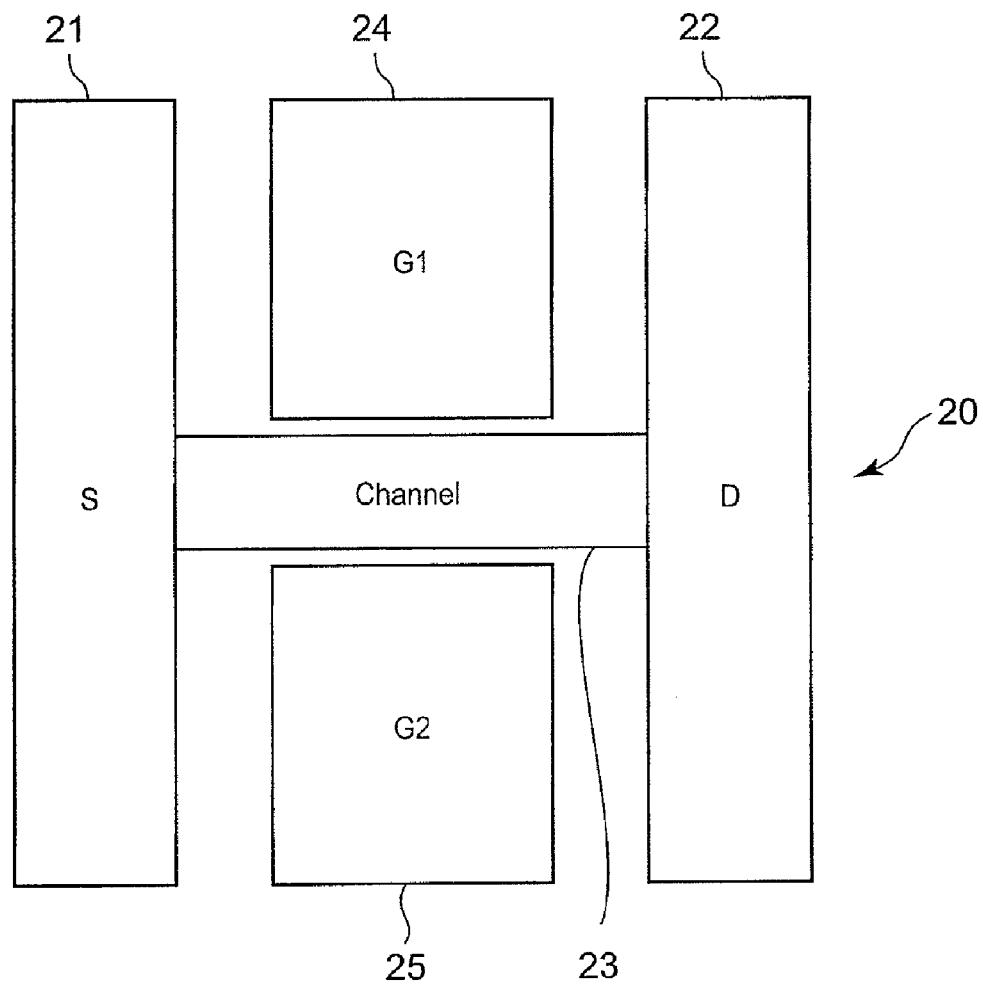
FIG. 6 is a diagram showing a full-graphene double-gate device according to Example 1 of the present invention.

FIG. 6 is a diagram showing a full-graphene double-gate field-effect transistor produced by the manufacturing method shown in FIGS. 5A to 5D.

Referring to FIG. 6, a full-graphene double-gate field-effect transistor 20 has a structure including a source electrode 21 formed of metal graphene integrally with interconnections, a drain electrode 22 formed of metal graphene integrally with interconnections, a channel 23 formed so as to connect the source electrode 21 and the drain electrode 22 to each other, and two gate electrodes 24 and 25 opposed to each other so as to interpose the channel 23 therebetween. The advantages of this structure include the following two aspects.

One aspect is excellent gate controllability and readiness to establish an off state because electric fields from the two gate electrodes 24 and 25 can be applied symmetrically to the channel.

The other aspect is that, when the two gate electrodes 24 and 25 are designed asymmetrically in size, it is possible to use a larger one as a general gate electrode for on/off operation and a smaller one as an electrode for shifting a threshold of a gate voltage. This double-gate system enables precise control of the threshold of the gate voltage.

EXAMPLE 2

FIGS. 7A to 7C are diagrams showing complementary inverters 30a, 30b, and 30c of a full-graphene device produced by the same manufacturing method as shown in FIGS. 5A to 5D. FIG. 7A shows an inverter in which p-type and n-type channels are controlled by two independent gate electrodes. FIG. 7B shows an inverter in which p-type and n-type channels are positioned on the same line and controlled by one gate electrode. FIG. 7C shows an inverter in which p-type and n-type channels are positioned in parallel to each other and controlled by one gate electrode.

Referring to the complementary inverter 30a in FIG. 7A, a p-type channel 31 and an n-type channel 32 are formed of semiconductor graphene, and electrodes such as gate electrodes 33, which also serve as interconnections, are formed of metal graphene. The reference numeral 34 denotes an output voltage $V_{out}$, the reference numeral 35 an input voltage $V_{in}$, the reference numeral 37 a power source voltage $V_{DD}$, and the reference numeral 36 a ground potential $V_{GND}$. The important point here is that the zigzag edge direction for metal characteristics is perpendicular to the armchair edge direction for semiconductor characteristics.

Referring to the complementary inverter 30b in FIG. 7B, a p-type channel 31 and an n-type channel 32 are formed of semiconductor graphene, and electrodes such as a gate electrode 33, which also serves as an interconnection, are formed of metal graphene. The reference numeral 34 denotes an output voltage $V_{out}$, the reference numeral 35 an input voltage $V_{in}$, the reference numeral 37 a power source voltage $V_{DD}$, and the reference numeral 36 a ground potential $V_{GND}$. As with the complementary inverter 30a shown in FIG. 7A, the important point here is that the zigzag edge direction for metal characteristics is perpendicular to the armchair edge direction for semiconductor characteristics.

Referring to the complementary inverter 30c in FIG. 7C, a p-type channel 31 and an n-type channel 32 are formed of semiconductor graphene, and electrodes such as a gate electrode 33, which also serves as an interconnection, are formed of metal graphene. The reference numeral 34 denotes an output voltage $V_{out}$, the reference numeral 35 an input voltage $V_{in}$, the reference numeral 37 a power source voltage $V_{DD}$, and the reference numeral 36 a ground potential $V_{GND}$. As with the complementary inverter 30a shown in FIG. 7A and the complementary inverter 30b shown in FIG. 7B, the important point here is that the zigzag edge direction for metal characteristics is perpendicular to the armchair edge direction for semiconductor characteristics.

In FIGS. 7A to 7C, zigzag edges appear in the vertical direction (metal direction 14) of the paper and are used for electrodes and interconnections. Armchair edges appear in the lateral direction (semiconductor direction 15) and are used for channels.

The gate electrode 33 of the complementary inverter 30b shown in FIG. 7B and the complementary inverter 30c shown in FIG. 7C has armchair edges in its major axis direction. Nevertheless, since the gate electrode 33 has a very large width, it serves as a metal.

When the structures of the complementary inverters 30a, 30b, and 30c in FIGS. 7A to 7C are compared with each other, the complementary inverter 30a of FIG. 7A has two gate electrodes, whereas the complementary inverter 30b of FIG. 7B and the complementary inverter 30c of FIG. 7C have one gate electrode. Therefore, the complementary inverter 30b of FIG. 7B and the complementary inverter 30c of FIG. 7C are advantageous over the complementary inverter 30a of FIG. 7A in that the number of component elements can be reduced.

Meanwhile, in the complementary inverter 30a of FIG. 7A, each of the gate electrodes 33 has an edge structure of zigzag edges in its major axis. Therefore, the complementary inverter 30a of FIG. 7A is advantageous in that the width of the complementary inverter can be made smaller than those of other inverters.

Furthermore, when the complementary inverter 30b of FIG. 7B and the complementary inverter 30c of FIG. 7C are compared with each other, the complementary inverter 30b of FIG. 7B, which is symmetrical, is advantageously simpler than the complementary inverter 30c of FIG. 7C from the viewpoint of the layouts.

Meanwhile, the gate electrode of the complementary inverter 30b of FIG. 7B is disadvantageously larger than that of the complementary inverter 30c of FIG. 7C. Thus, each of the device structures has both advantages and disadvantages. From another point of view, it can be said that graphene devices have a high degree of flexibility in layout design. In other words, one of features of the present invention is that a flexible circuit design can be made depending upon the intended use or purpose.

EXAMPLE 3

Figures 8A, 8B, 8C:
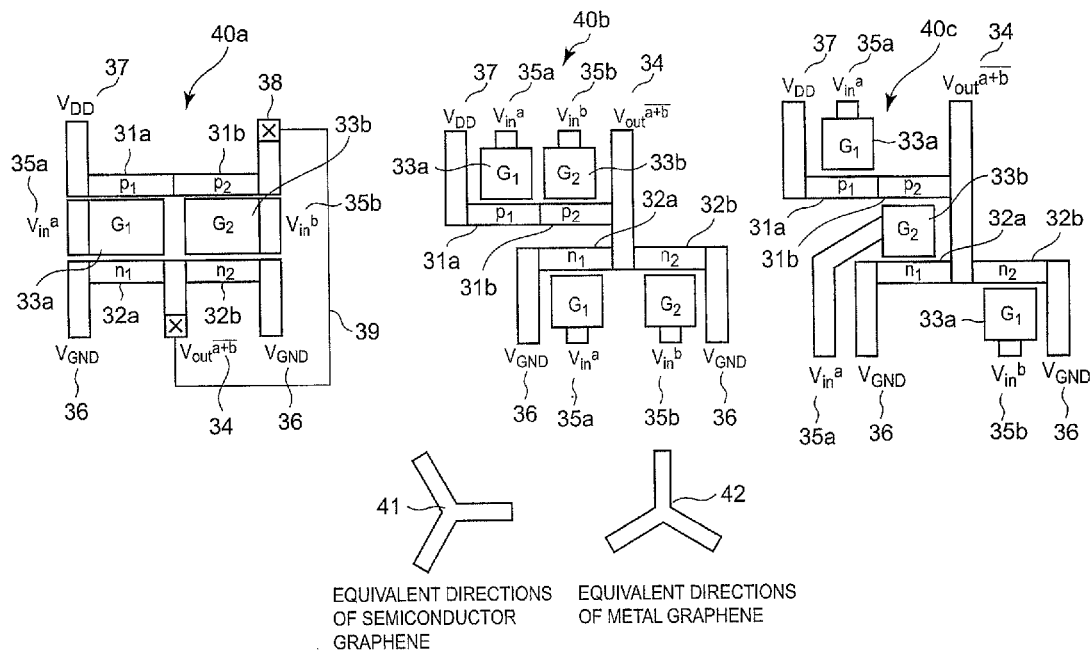
FIGS. 8A to 8C are diagrams showing full-graphene NOR gates according to Example 3 of the present invention.

FIGS. 8A to 8C are diagrams showing NOR gates 40a, 40b, and 40c of complementary inverters produced by the manufacturing method shown in FIGS. 5A to 5D.

In FIGS. 8A to 8C, the number of gate electrodes is two in the NOR gate 40a of FIG. 8A, four in the NOR gate 40b of FIG. 8B, and three in the NOR gate 40c of FIG. 8C. The reference numeral 41 denotes three equivalent directions of a semiconductor graphene, and the reference numeral 42 denotes three equivalent directions of a metal graphene. Those directions are common to FIGS. 8A, 8B, and 8C.

The NOR gate 40a shown in FIG. 8A has the smallest number of gate electrodes. Outputs ($V_{out}$) 34 should be drawn out of the plane through vias 38. The reference numerals 31a and 31b denote first and second p-type channels of semiconductor graphene, respectively, and the reference numerals 32a and 32b denote first and second n-type channels of semiconductor graphene, respectively. The reference numerals 33a and 33b denote first and second gate electrodes of metal graphene, respectively. The reference numeral 34 denotes an output voltage $V_{out}$, the reference numerals 35a and 35b input voltages a and b ($V_{in}^a$ and $V_{in}^b$), respectively, the reference numeral 36 a ground potential $V_{GND}$, and the reference numeral 37 a power source voltage $V_{DD}$.

The NOR gate 40b shown in FIG. 8B has first and second p-type channels 31a and 31b of semiconductor graphene and first and second n-type channels 32a and 32b of semiconductor graphene. A source electrode on the second p-type channel 31b is connected between the first and second n-type channels 32a and 32b. First and second gate electrodes 33a and 33b of metal graphene are provided near the p-type and n-type channels. The reference numeral 34 denotes an output voltage $V_{out}$, the reference numerals 35a and 35b input voltages a and b ($V_{in}^a$ and $V_{in}^b$), respectively, the reference numeral 36 a ground potential $V_{GND}$, and the reference numeral 37 a power source voltage $V_{DD}$.

The NOR gate 40c shown in FIG. 8C has first and second p-type channels 31a and 31b of semiconductor graphene and first and second n-type channels 32a and 32b of semiconductor graphene. A source electrode on the second p-type channel 31b is connected between the first and second n-type channels 32a and 32b. Two first gate electrodes 33a of metal graphene and one second gate electrode 33b of metal graphene are provided near the p-type and n-type channels. The reference numeral 34 denotes an output voltage $V_{out}$, the reference numerals 35a and 35b input voltages a and b ($V_{in}^a$ and $V_{in}^b$), respectively, the reference numeral 36 a ground potential $V_{GND}$, and the reference numeral 37 a power source voltage $V_{DD}$.

Meanwhile, each of the NOR gate 40b of FIG. 8B and the NOR gate 40c of FIG. 8C can have its components including interconnections within the plane. Furthermore, in the NOR gate 40c of FIG. 8C, one gate electrode has been eliminated by introducing 120-degree rotation to one interconnection between the second gate electrode 33b and the input 35a. Thus, introduction of 120-degree rotation can simplify the layout of the device.

EXAMPLE 4

Figures 9A, 9B, 9C:
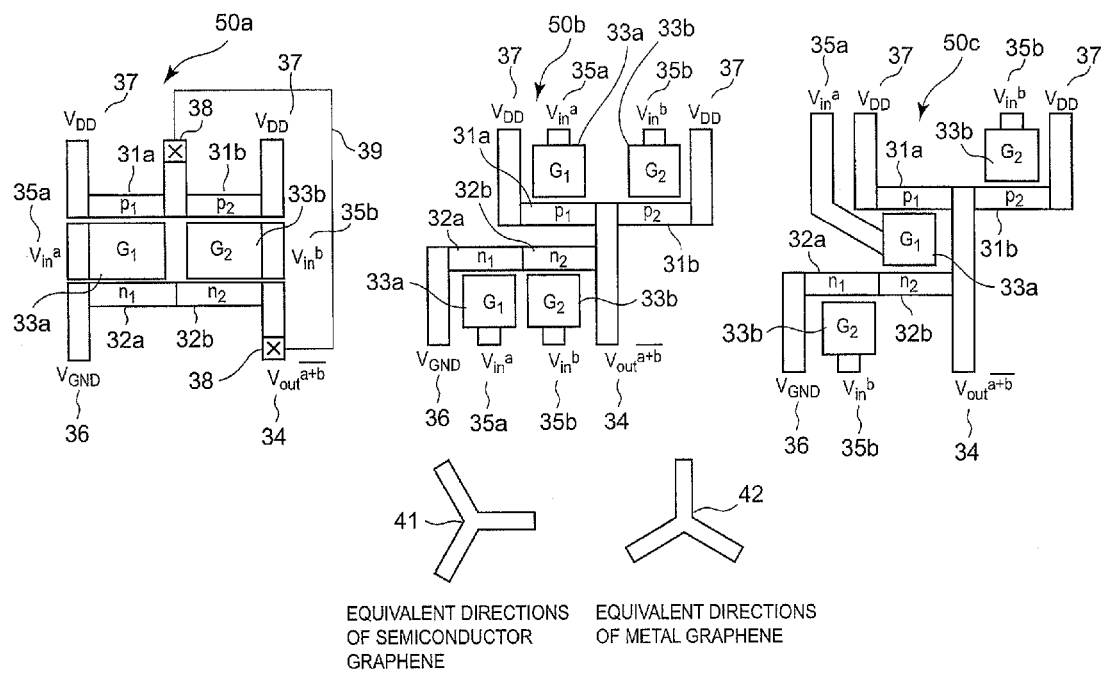
FIGS. 9A to 9C are diagrams showing full-graphene NAND gates according to Example 4 of the present invention.

FIGS. 9A to 9C are diagrams showing NAND gates 50a, 50b, and 50c of a complementary inverter produced by the manufacturing method shown in FIGS. 5A to 5D. In FIGS. 9A to 9C, the number of gate electrodes is two in the NAND gate 50a of FIG. 9A, four in the NAND gate 50b of FIG. 9B, and three in the NAND gate 50c of FIG. 9C. The reference numeral 41 denotes three equivalent directions of a semiconductor graphene, and the reference numeral 42 denotes three equivalent directions of a metal graphene. Those directions are common to FIGS. 9A, 9B, and 9C. The relationships between the routing of interconnections and the number of gate electrodes is the same as those of the NOR gates shown in FIGS. 8A to 8C.

Specifically, the NAND gate 50a shown in FIG. 9A has two gate electrodes 33a and 33b, i.e., the smallest number of gate electrodes. Outputs ($V_{out}$) 34 should be drawn out of the plane through vias 38. The reference numerals 31a and 31b denote first and second p-type channels of semiconductor graphene, respectively, and the reference numerals 32a and 32b denote first and second n-type channels of semiconductor graphene, respectively. The reference numerals 33a and 33b denote first and second gate electrodes of metal graphene, respectively. The reference numeral 34 denotes an output voltage $V_{out}$, the reference numerals 35a and 35b input voltages a and b ($V_{in}^a$ and $V_{in}^b$), respectively, the reference numeral 36 a ground potential $V_{GND}$, and the reference numeral 37 a power source voltage $V_{DD}$.

The NAND gate 50b shown in FIG. 9B has first and second p-type channels 31a and 31b of semiconductor graphene and first and second n-type channels 32a and 32b of semiconductor graphene. First and second gate electrodes 33a and 33b of metal graphene are provided near the p-type and n-type channels.

This NAND gate 50b differs from the NOR gate 40b shown in FIG. 8B in that a drain electrode on the second n-type channel 32b is connected between the first and second p-type channels 31a and 31b. The reference numeral 34 denotes an output voltage $V_{out}$, the reference numerals 35a and 35b input voltages a and b ($V_{in}^a$ and $V_{in}^b$), respectively, the reference numeral 36 a ground potential $V_{GND}$, and the reference numeral 37 a power source voltage $V_{DD}$.

The NAND gate 50c shown in FIG. 9C has first and second p-type channels 31a and 31b of semiconductor graphene and first and second n-type channels 32a and 32b of semiconductor graphene. Two first gate electrodes 33a of metal graphene and one second gate electrode 33b of metal graphene are provided near the p-type and n-type channels.

The NAND gate 50c differs from the NOR gate 40c shown in FIG. 8C in that a drain electrode on the second n-type channel 32b is connected between the first and second p-type channels 31a and 31b. The reference numeral 34 denotes an output voltage $V_{out}$, the reference numerals 35a and 35b input voltages a and b ($V_{in}^a$ and $V_{in}^b$), respectively, the reference numeral 36 a ground potential $V_{GND}$, and the reference numeral 37 a power source voltage $V_{DD}$.

Meanwhile, each of the NAND gate 50a of FIG. 9B and the NAND gate 50c of FIG. 9C can include its components within the plane.

Furthermore, in the NAND gate 50c of FIG. 9C, one gate electrode has been eliminated by introducing 120-degree rotation to an interconnection between the first gate electrode 33a and the input 35a, as with the NOR gate of FIG. 8C.

EXAMPLE 5

Figure 10A:
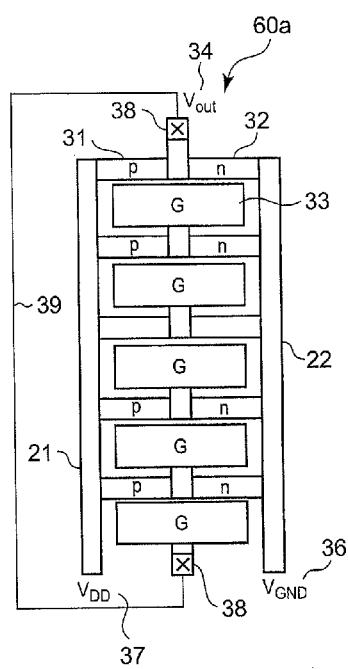
FIGS. 10A and 10B are diagrams showing ring oscillator circuits according to Example 5 of the present invention.
Figure 10B:
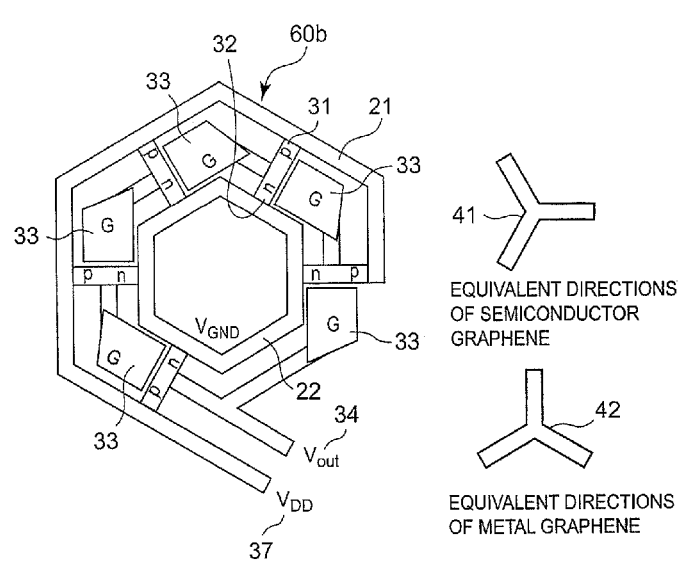

FIGS. 10A and 10B are diagrams showing a ring oscillator circuit that combines an odd number of full-graphene complementary inverters produced by the manufacturing method shown in FIGS. 5A to 5D. FIG. 10A shows a series-type ring oscillator circuit 60a, and FIG. 10B shows a loop-type ring oscillator circuit 60b. The reference numeral 41 denotes three equivalent directions of a semiconductor graphene, and the reference numeral 42 denotes three equivalent directions of a metal graphene. Those directions are common to FIGS. 10 and 10B.

As shown in FIG. 10A, a plurality of channels formed by connecting ends of a p-type channel 31 and an n-type channel 32 to each other in series are arranged in parallel so as to form a ring oscillator circuit 60a. Furthermore, the other ends of the p-type channels 31 and the n-type channels 32 are connected to a source electrode 21 and a drain electrode 22, respectively, so as to form a ladder-like shape. Gate electrodes 33 are formed within areas surrounded by the source electrode 21, the drain electrode 22, and the channels. Each connection portion between the p-type channel and the n-type channel is connected to the gate electrode above those channels, except the lowermost gate electrode. The lowermost gate electrode and a connection portion between the uppermost p-type and n-type channels are connected to each other through vias by a via interconnection.

As shown in FIG. 10B, a plurality of channels formed by connecting ends of a p-type channel 31 and an n-type channel 32 to each other in series are arranged in a circumferential direction to form a ring oscillator circuit 60b. Furthermore, the other ends of the p-type channels 31 and the n-type channels 32 are connected to an outside hexagonal source electrode 21 and an inside hexagonal drain electrode 22, respectively, so as to form a roughly hexagonal shape. Gate electrodes 33 are formed within areas surrounded by the source electrode 21, the drain electrode 22, and the channels. Each of the gate electrodes 33 is connected to a connection portion between the p-type channel 31 and the n-type channel 32.

As with the device shown in FIGS. 9A to 9C, the components are perpendicular to each other. In the ring oscillator circuit 60b of FIG. 10B, the components intersect at an angle of 90 degrees or 120 degrees. The intersection at an angle of 120 degrees is permissible because graphene has a three-fold rotoreflection axis. In other words, the intersection at an angle of 120 degrees is permissible because zigzag edges and armchair edges respectively appear with every 120-degree rotation. Use of this 120-degree directional equivalency enables flexible selection of devices and circuit configurations.

EXAMPLE 6

Figure 11:
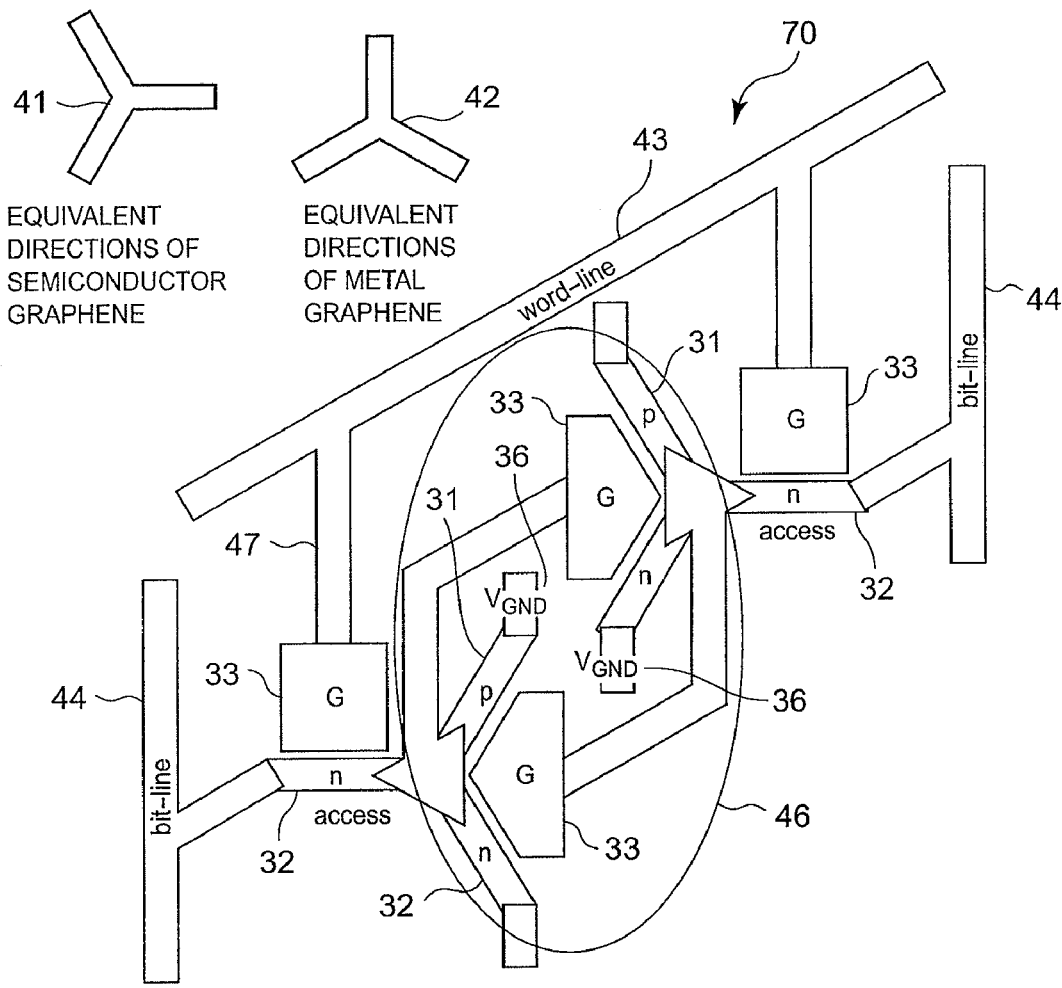
FIG. 11 is a diagram showing a full-graphene NAND gate having flip-flop circuits according to Example 6 of the present invention.

FIG. 11 shows a full-graphene SRAM 70 having flip-flop circuits produced by the above manufacturing method. Referring to FIG. 11, the SRAM 70 operates as a memory cell. As with Example 5, semiconductor graphene is used for p-type and n-type channels 31 and 32 jointed to each other at an angle of 120 degrees. Metal graphene is used for electrodes such as gate electrodes 33. Metal graphene is used for a word-line 43 and bit-lines 44. The components are put within the plane by introduction of 120-degree rotation.

As described above, according to the present invention, there is provided a semiconductor device using a field effect, characterized by comprising: a channel layer formed of semiconductor graphene; electrode layers formed of metal graphene for a source, a drain, and a gate, the electrode layers serving as interconnections as well; and a gate insulating layer for insulating the channel layer and the gate electrode layer from each other, wherein the channel layer and the electrode layers are located on the same plane.

Furthermore, according to the present invention, there is provided a semiconductor device characterized in the aforementioned semiconductor device in that the channel comprises a graphene having an armchair edge with a width of 20 nm or less, and the electrodes comprise a graphene having any edge structure with a width larger than 20 nm or a graphene having a zigzag edge with a width of 20 nm or less.

Moreover, according to the present invention, there is provided a semiconductor device characterized in one of the aforementioned semiconductor devices in that the channel comprises a graphene provided with p-type or n-type conduction by doping.

Furthermore, according to the present invention, there is provided a semiconductor device characterized in one of the aforementioned semiconductor devices in that the channel comprises a graphene provided with p-type conduction by substituting one element of boron, aluminum, gallium, and indium, or any combination thereof for part of constituent carbon, or a graphene provided with n-type conduction by substituting one element of nitrogen, phosphorus, arsenic, and antimony, or any combination thereof for part of constituent carbon.

Moreover, according to the present invention, there is provided a semiconductor device characterized in one of the aforementioned semiconductor devices in that the channel comprises a graphene provided with p-type conduction by arranging an acceptor on its surface, or a graphene provided with n-type conduction by arranging a donor on its surface.

Furthermore, according to the present invention, there is provided a semiconductor device characterized in the aforementioned semiconductor device in that the acceptor has an electron affinity higher than an effective work function of the semiconductor graphene, and that the donor has an ionization energy lower than an effective work function of the semiconductor graphene.

Moreover, according to the present invention, there is provided a semiconductor device characterized in the aforementioned semiconductor device in that the acceptor has an electron affinity higher than 2.3 eV, and the donor has an ionization energy lower than 6.4 eV.

Furthermore, according to the present invention, there is provided a semiconductor device characterized in one of the aforementioned semiconductor devices in that the semiconductor device comprises an inverter into which p-type and n-type channels are combined in a complementary manner.

Moreover, according to the present invention, there is provided a semiconductor device characterized in one of the aforementioned semiconductor devices in that the semiconductor device comprises a memory cell or a logic circuit including as a fundamental circuit an inverter into which p-type and n-type channels are combined in a complementary manner.

Furthermore, according to the present invention, there is provided a method of manufacturing a semiconductor device, characterized by comprising: producing a graphene on a substrate; forming the graphene into a desired device structure through lithography and etching; forming an edge structure of the graphene into a zigzag edge or an armchair edge through oxidation reaction or reduction reaction; doping the semiconductor graphene; and depositing an insulating film.

Moreover, according to the present invention, there is provided a method of manufacturing a semiconductor device, characterized in the aforementioned method in that the process of producing the graphene on the appropriate substrate comprises a graphene formation method using pyrolysis on an SiC substrate.

Furthermore, according to the present invention, there is provided a method of manufacturing a semiconductor device, characterized in the aforementioned method in that the process of producing the graphene on the appropriate substrate comprises a graphene formation method including processing a surface of a graphite such as a highly-oriented pyrolytic graphite (HOPG) and dispersing graphenes on the substrate.

Moreover, according to the present invention, there is provided a method of manufacturing a semiconductor device, characterized in one of the aforementioned methods in that the process of doping the semiconductor graphene comprises a p-type lattice-substitution doping of substituting one element of boron, aluminum, gallium, and indium, or any combination thereof for part of constituent carbon in the semiconductor graphene, or an n-type lattice-substitution doping of substituting one element of nitrogen, phosphorus, arsenic, and antimony, or any combination thereof for part of constituent carbon.

Furthermore, according to the present invention, there is provided a method of manufacturing a semiconductor device, characterized in one of the aforementioned methods in that the process of doping the semiconductor graphene comprises charge-transfer doping of arranging an acceptor on a surface of the semiconductor graphene to provide p-type conduction, or charge-transfer doping of arranging a donor on a surface of the semiconductor graphene to provide n-type conduction.

Thus, the present invention has been described in detail based on some embodiments. The present invention is not limited to the above embodiments. Various changes and modifications may be made without departing from the scope of the present invention. Those variations shall be included in the present invention.

For example, a logic circuit or a memory cell having a high degree of integration can be produced by the aforementioned manufacturing method.

Industrial Applicability

Examples of use of the present invention include semiconductor devices such as a field-effect transistor, a logic circuit, and a memory cell circuit having features of low electric power consumption and ultrahigh speed operation.

This application is based upon Japanese patent application No. 2007-52887, filed on Mar. 2, 2007, the disclosure of which is incorporated herein by reference in its entirety.

The invention claimed is:

1. A semiconductor device using a field effect, comprising:
   a channel layer formed of semiconductor graphene;
   electrode layers formed of metal graphene for a source, a drain, and a gate, the electrode layers serving as interconnections; and
   a gate insulating layer for insulating the channel layer and the gate electrode layer from each other,
   wherein the channel layer and the electrode layers are located on the same plane;
   wherein,
   the semiconductor graphene has an armchair edge with a width of 20 nm or less while the metal graphene has a zigzag edge with a width of 20 nm or less.

2. The semiconductor device as recited in claim 1, wherein:
   the channel comprises a graphene provided with p-type or n-type conduction by doping.

3. The semiconductor device as recited in claim 1, wherein:
   the channel comprises a graphene provided with p-type conduction by substituting one element of boron, aluminum, gallium, and indium, or any combination thereof for part of constituent carbon, or a graphene provided with n-type conduction by substituting one element of nitrogen, phosphorus, arsenic, and antimony, or any combination thereof for part of constituent carbon.

4. The semiconductor device as recited in claim 1, wherein:
   the channel comprises a graphene provided with p-type conduction by arranging an acceptor on its surface, or a graphene provided with n-type conduction by arranging a donor on its surface.

5. The semiconductor device as recited in claim 4, wherein:
   the acceptor has an electron affinity higher than an effective work function of the semiconductor graphene, and the donor has an ionization energy lower than an effective work function of the semiconductor graphene.

6. The semiconductor device as recited in claim 4, wherein:
   the acceptor has an electron affinity higher than 2.3 eV, and the donor has an ionization energy lower than 6.4 eV.

7. The semiconductor device as recited in claim 1, wherein:
   the semiconductor device comprises an inverter into which p-type and n-type channels are combined in a complementary manner.

8. The semiconductor device as recited in claim 1, wherein:
   the semiconductor device comprises a memory cell or a logic circuit including as a fundamental circuit an inverter into which p-type and n-type channels are combined in a complementary manner.

* * * * *